(12) United States Patent
Rowley

(10) Patent No.: US 11,024,345 B2
(45) Date of Patent: *Jun. 1, 2021

(54) POWER MANAGEMENT INTEGRATED CIRCUIT LOAD SWITCH DRIVER WITH DYNAMIC BIASING

(71) Applicant: Micron Technology, Inc., Boise, ID (US)

(72) Inventor: Matthew David Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/001,548

(22) Filed: Aug. 24, 2020

(65) Prior Publication Data

US 2020/0388307 A1    Dec. 10, 2020

Related U.S. Application Data

(63) Continuation of application No. 16/661,904, filed on Oct. 23, 2019, now Pat. No. 10,755,750, which is a continuation of application No. 15/919,020, filed on Mar. 12, 2018, now Pat. No. 10,504,562.

(51) Int. Cl.
| | | |
|---|---|---|
| *G11C 5/14* | (2006.01) | |
| *G11C 11/4074* | (2006.01) | |
| *G06F 1/28* | (2006.01) | |
| *G06F 1/30* | (2006.01) | |
| *H03K 17/687* | (2006.01) | |

(52) U.S. Cl.
CPC ............... *G11C 5/147* (2013.01); *G06F 1/28* (2013.01); *G06F 1/305* (2013.01); *G11C 5/145* (2013.01); *G11C 11/4074* (2013.01); *H03K 17/687* (2013.01)

(58) Field of Classification Search
CPC .......... G11C 5/147; G11C 5/145; G06F 1/28; G06F 1/305; H03K 17/687
See application file for complete search history.

(56) References Cited

U.S. PATENT DOCUMENTS

| | | |
|---|---|---|
| 7,852,125 B2 | 12/2010 | Lopez et al. |
| 8,199,545 B2 | 6/2012 | Nguyen et al. |
| 10,121,519 B2 | 11/2018 | Eguchi et al. |
| 10,224,918 B2 | 3/2019 | Vytla et al. |
| 10,504,562 B2 | 12/2019 | Rowley |
| 10,755,750 B2 | 8/2020 | Rowley |
| 2012/0170335 A1 | 7/2012 | Lee et al. |

(Continued)

*Primary Examiner* — Tri M Hoang
(74) *Attorney, Agent, or Firm* — Greenberg Traurig

(57) ABSTRACT

Disclosed is an improved load switch driver for Power Management Integrated Circuit (PMIC) devices. In one embodiment, a PMIC is disclosed comprising a gate driver, the gate driver connected to the gate of a switch; an operation frequency generator connected to the gate driver and configured to supply a periodic voltage to the gate driver; and a voltage sensor, the voltage sensor connected to the operation frequency generator and the source of the switch, the voltage sensor configured to monitor a drain-source voltage of the switch and lower the frequency of the operation frequency generator to a second frequency in response to detecting a collapse of the drain-source voltage.

20 Claims, 4 Drawing Sheets

(56) References Cited

U.S. PATENT DOCUMENTS

| | | | |
|---|---|---|---|
| 2015/0179234 A1* | 6/2015 | Kawase | ................ G11C 5/148 |
| | | | 365/185.08 |
| 2015/0365006 A1 | 12/2015 | Choi | |
| 2016/0156259 A1 | 6/2016 | Zhang et al. | |
| 2016/0181801 A1* | 6/2016 | Shimizu | .................... G06F 1/26 |
| | | | 307/19 |
| 2017/0063223 A1* | 3/2017 | Raghupathy | .............. G05F 1/56 |
| 2018/0046390 A1 | 2/2018 | Matsumoto et al. | |
| 2018/0159520 A1 | 6/2018 | Vytla et al. | |
| 2018/0286465 A1 | 10/2018 | Eguchi et al. | |
| 2019/0279688 A1 | 9/2019 | Rowley | |
| 2020/0058331 A1 | 2/2020 | Rowley | |

\* cited by examiner

POWER MANAGEMENT INTEGRATED CIRCUIT LOAD SWITCH DRIVER WITH DYNAMIC BIASING

RELATED APPLICATIONS

The present application is a continuation application of U.S. patent application Ser. No. 16/661,904, filed Oct. 23, 2019, issued as U.S. Pat. No. 10,755,750 on Aug. 25, 2020, which is a continuation application of U.S. patent application Ser. No. 15/919,020, filed Mar. 12, 2018, issued as U.S. Pat. No. 10,504,562 on Dec. 10, 2019, both entitled "Power Management Integrated Circuit Load Switch Driver with Dynamic Biasing", the entire contents of which applications are hereby incorporated by reference as if fully set forth herein.

FIELD OF THE TECHNOLOGY

At least some embodiments disclosed herein relate to Power Management Integrated Circuit (PMIC) in general and, more particularly but not limited to, a PMIC load switch driver with dynamic biasing.

BACKGROUND

A memory system can be a storage system, such as a Solid-State Drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system. Load switches are commonly used in memory systems to isolate power domains during non-operational modes. For example, current SSDs support (in addition to active power modes) both sleep and low power modes. The use of load switches allows for finer-grained control of power sequences, preventing damaging in-rush currents.

In general, load switch drivers utilize a gate control circuit that continuously charges the gate of a switch driven by the switch. The continuous charging of the gate consumes a significant amount of power during operation. This power usage is exacerbated when the PMIC is maintaining a power domain in a low power or sleep mode.

BRIEF DESCRIPTION OF THE DRAWINGS

The disclosed embodiments may best be understood by referring to the following description and accompanying drawings that are used to illustrate embodiments of the disclosure.

DETAILED DESCRIPTION

Aspects of the present disclosure are directed to a Power Management Integrated Circuit (PMIC) in a memory system. An example of a memory system is a storage system, such as a Solid-State Drive (SSD). In some embodiments, the memory system is a hybrid memory/storage system. In general, a host system can utilize a memory system that includes one or more memory devices. The memory devices can include media. The media can be non-volatile memory devices, such as, for example, negative-and (NAND). The host system can provide write requests to store data at the memory devices of the memory system and can provide read requests to retrieve data stored at the memory system. A memory system can include a controller that manages the memory devices to perform operations such as reading data, writing data, or erasing data and other such operations. A storage system (also hereinafter referred to as storage device) is used as one example of the memory system hereinafter throughout this document.

Figure 1:
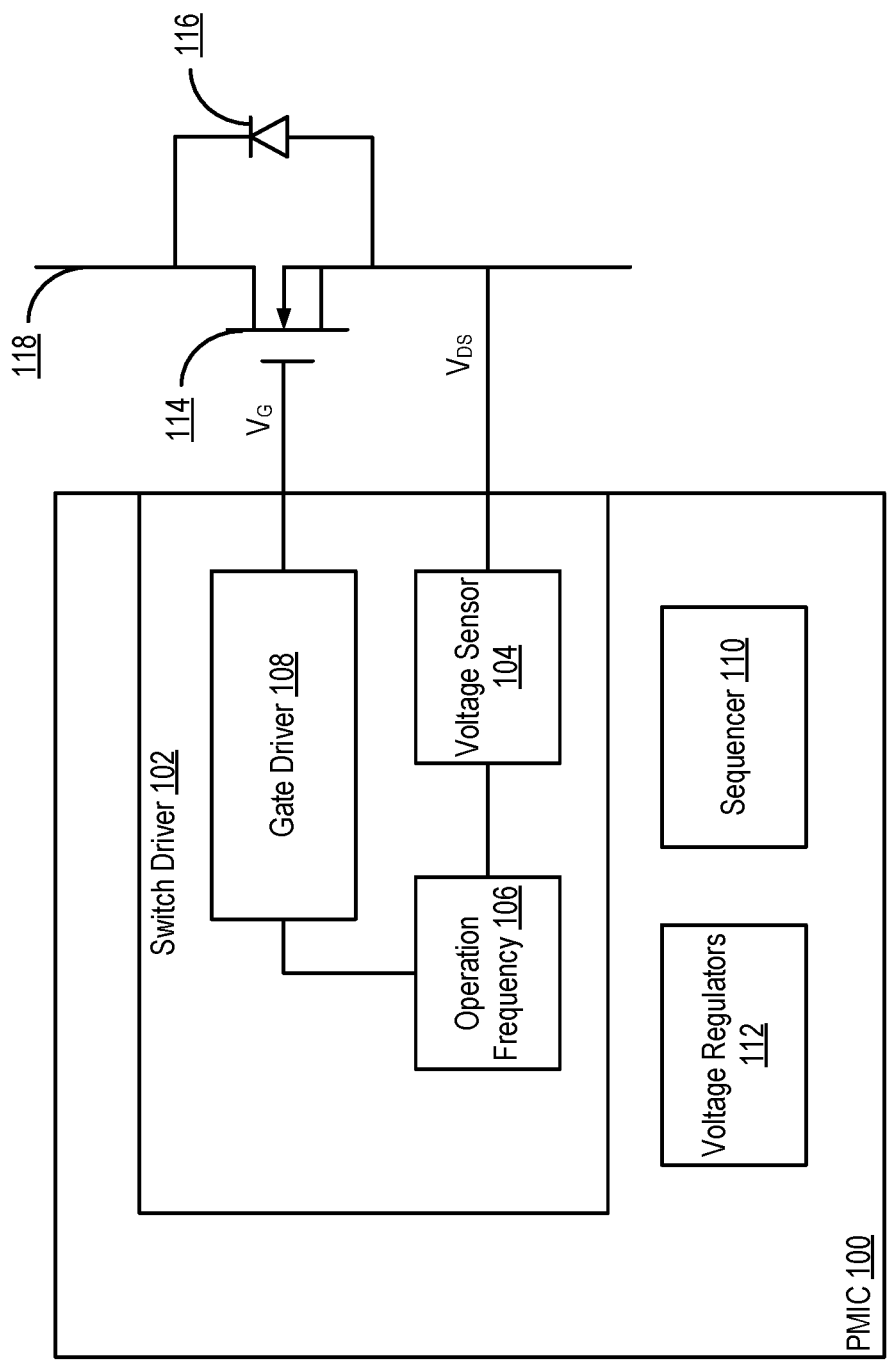
FIG. 1 is a circuit diagram illustrating a dynamically biasing a load switch driver in a power management integrated circuit according to some embodiments of the disclosure.

FIG. 1 is a circuit diagram illustrating a dynamically biasing a load switch driver in a power management integrated circuit according to some embodiments of the disclosure.

A PMIC (100) is primarily concerned with managing the power requirements of one or more external components of a computing device. A PMIC (100) manages aspect of power regulation such as sequencing (e.g., the sequence in which the power is applied and shut down as well as the intervals between operations in the sequence), managing the supply of power to various power domains (including adjustment of voltage requirements), preventing overvoltage and undervoltage conditions, handle power inputs from multiple sources (e.g., AC power supplies, DC battery supplies, etc.). In essence, a PMIC acts as an abstraction layer between an external power source and a component requiring power.

The PMIC (100) has one or more voltage regulators (112) that convert the external power supply to the PMIC (100) to operating voltages used by various components of the device (or devices) powered by the PMIC (100) (e.g., solid-state storage devices, dynamic random-access memory (DRAM), etc.). The PMIC (100) includes a sequencer (110) that schedules the power-related events according to desirable sequences for the operations of the supported devices, including the sequences of the operations of the voltage regulators (102).

The PMIC (100) additionally includes a switch driver (102). Although only a single switch driver (102) is illustrated, the PMIC (100) may include multiple identically structured switch drivers. In some embodiments, the PMIC (100) include a switch driver for each power domain.

The switch driver (102) controls the gate voltage of switch (114). In one embodiment, switch (114) comprises a MOSFET switch. In the illustrated embodiment, switch (114) comprises an n-channel MOSFET switch. In some embodiments, a p-channel MOSFET switch may be used. In this embodiment, gate driver (108) may be optional. The switch (114) is connected in parallel to diode (116). In the illustrated embodiment, diode (116) prevents reverse current from flowing through the rail (118).

The switch driver (102) includes a charge pump or in some embodiments a push-pull driver as the gate driver (108). As used in FIG. 1, the gate driver (108) increases the gate voltage ($V_g$) to activate the switch (114). Gate driver (108) increase the voltage supplied from operation frequency generator (106) to raise the voltage ($V_g$) of the switch (114) to the required turn-on threshold voltage. In the illustrated embodiment, switch (114) is constructed using seven to eight mask steps during fabrication of PMIC (100). Gate driver (108) is driven by operation frequency generator (106). In one embodiment, operation frequency generator (106) comprises a voltage controlled oscillator connected to the input of gate driver (108). In some embodiments, operation frequency generator (106) generates a high-frequency voltage signal that operates to charge the capacitors of the gate driver (108). In the illustrated embodiment, the output frequency of operation frequency generator (106) may be tuned.

The switch driver (102) includes a voltage sensor (104). Voltage sensor (104) monitors the drain-to-source voltage across FET switch (114). Voltage sensor (104) monitors changes in the $V_{DS}$ voltage to monitor the saturation of the FET switch (114). For example, by detecting a collapse in $V_{DS}$, the voltage sensor (104) can detect that the FET switch is fully saturated. By identifying that the FET switch (114) is fully saturated, the voltage sensor (104) can determine that the FET switch (114) is fully turned on upon detecting the collapsed $V_{DS}$ voltage.

As illustrated, gate driver (108) is designed to operate at a first frequency (e.g., 200-400 kHz). The frequency of the gate driver (108) is controlled via voltage sensor (104). In a first embodiment, gate driver (108) is set to operate a first frequency to amplify the PMIC (100) base voltage and turn on the switch via gate voltage $V_G$. Prior to reaching $V_{TH}$, $V_{DS}$ is zero. After turning on the switch (i.e., $V_G > V_{TH}$), the voltage sensor (104) monitors $V_{DS}$ continuously. In the illustrated embodiment, sensor (104) monitors the ramp rate of $V_{DS}$ to ensure that the voltage increase meets the ramp rate specified by the PMIC (100).

The sensor (104) continuously monitors $V_{DS}$ (and thus ramp rate) to determine when the switch (114) is fully saturated (i.e., "on"). The sensor (104) detects this fully saturated state when the value of $V_{DS}$ eventually collapses.

Upon detecting that the switch (114) is fully on, the voltage sensor (104) transmits a signal to operation frequency generator (106) to lower the frequency of the oscillator driving gate driver (108) to a second frequency (e.g., between 8.5-12 kHz). In one embodiment, the second frequency comprises a pre-defined frequency suitable for maintaining operation of the gate driver (108) and, by proxy, maintaining a suitable $V_G$ value to keep the switch (114) on during operation.

As illustrated, prior to $V_{DS}$ collapse, the operation frequency generator (106) is operating at a high frequency, thus consuming a significant amount of power. By lowering the frequency after $V_{DS}$ collapse, the load switch driver (102) reduces power consumption after fast turn-on of the switch (114). In some embodiments, the PMIC (100) is configured with multiple load switch drivers (e.g., three separate load switch drivers). Thus, the reduced power consumption is linearly related to the number of load switch drivers (102) in the system. In some embodiments, a load switch driver (102) may also be used as an in-rush controller controlling a FET switch to isolate individual drives of an SSD device powered by the PMIC (100).

Figure 2:
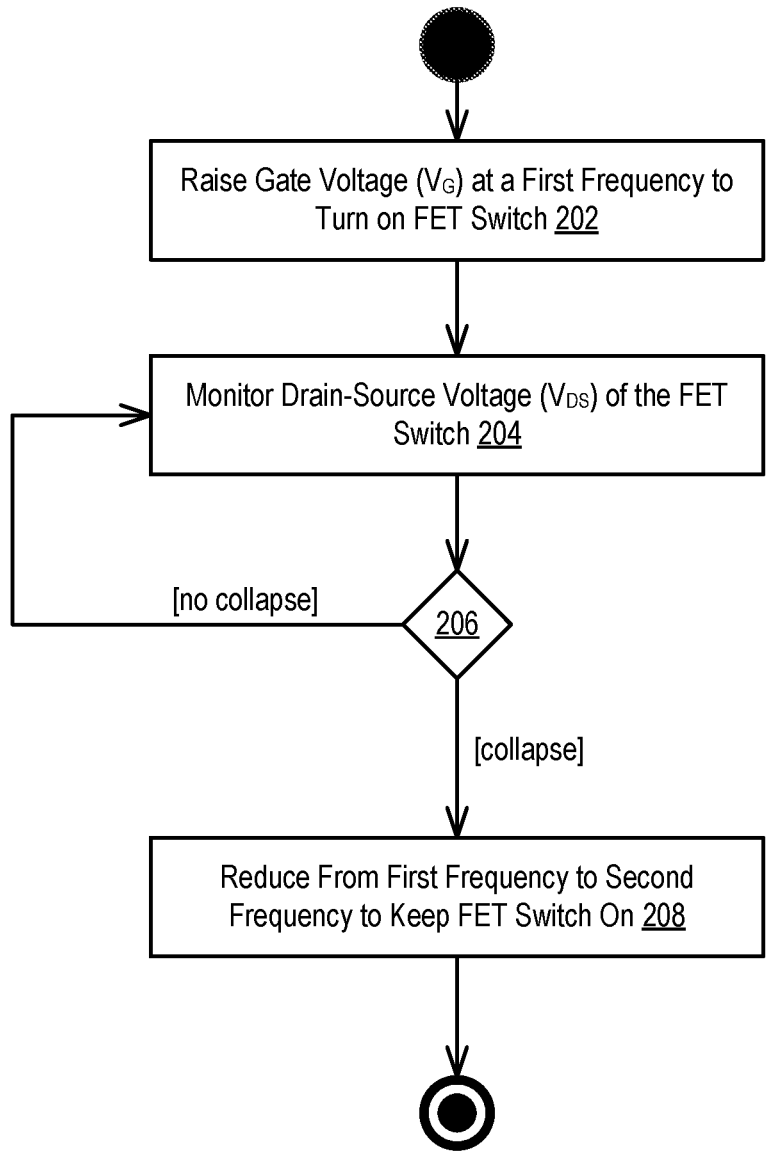
FIG. 2 is a flow diagram illustrating a method for varying the operational frequency of a load switch according to some embodiments of the disclosure.

FIG. 2 is a flow diagram illustrating a method for varying the operational frequency of a load switch according to some embodiments of the disclosure. The illustrated may be performed by a load switch driver and components thereof.

At block 202, the method raises the gate voltage ($V_G$) at a first frequency to turn on a FET switch.

In one embodiment, the first frequency may be a high frequency (e.g., between 200 and 400 kHz). In the illustrated embodiment, the first frequency is used to rapidly charge a charge pump used to drive the FET switch. The high frequency results in quickly reaching the threshold voltage ($V_{TH}$) required to start turning on the switch. Upon reaching the threshold voltage, a channel between the drain of the switch (e.g., a power rail) and the source of the switch (connected to a load) is opened and the resistance is lowered as the switch saturates at the first frequency.

In one embodiment, the operation at block 202 may be performed by a charge pump or push pull driver (a gate driver) connected to the gate of the switch. The gate driver is controlled by a voltage controlled oscillator (an operation frequency generator).

At block 204, the method monitors the drain-source voltage ($V_{DS}$) of the FET switch.

In one embodiment, a voltage sensor is connected to the source of the FET switch and continuously monitors $V_{DS}$ while the switch is turning on. As known, the $V_{DS}$ increase during charging of the gate (i.e., the ohmic region). Once saturated, $V_{DS}$ continues to increase until reaching the switch's breakdown voltage (i.e., when $V_{DS}$ collapses).

At block 206, the method monitors $V_{DS}$ to determine whether $V_{DS}$ has collapsed and the FET is fully saturated.

In one embodiment, the voltage sensor monitors $V_{DS}$ to determine the collapse. In one embodiment, the voltage sensor monitors the value of $V_{DS}$ in comparison to a known breakdown voltage of the FET switch. Alternatively, the voltage sensor monitors the instantaneous voltage changes of $V_{DS}$ to detect a breakdown in $V_{DS}$.

If $V_{DS}$ has not collapsed, the method continues to drive the charge pump at the first frequency, increasing the amount of charge stored in the gate of the FET switch. Alternatively, when the method detects that $V_{DS}$ has collapsed, the method reduces the frequency of the operation frequency generator to a second frequency to maintain the charge at the gate of the FET switch and thus maintain the channel of the FET switch.

When $V_{DS}$ collapses, the gate of the FET switch is fully charged and is at maximum capacitance. Thus, the method reduces the frequency of the charge pump to simply maintain the gate voltage, and thus charge, of the FET switch. In one embodiment, the reduced frequency is used to trickle charge the gate to maintain the operation of the switch.

Figure 3:
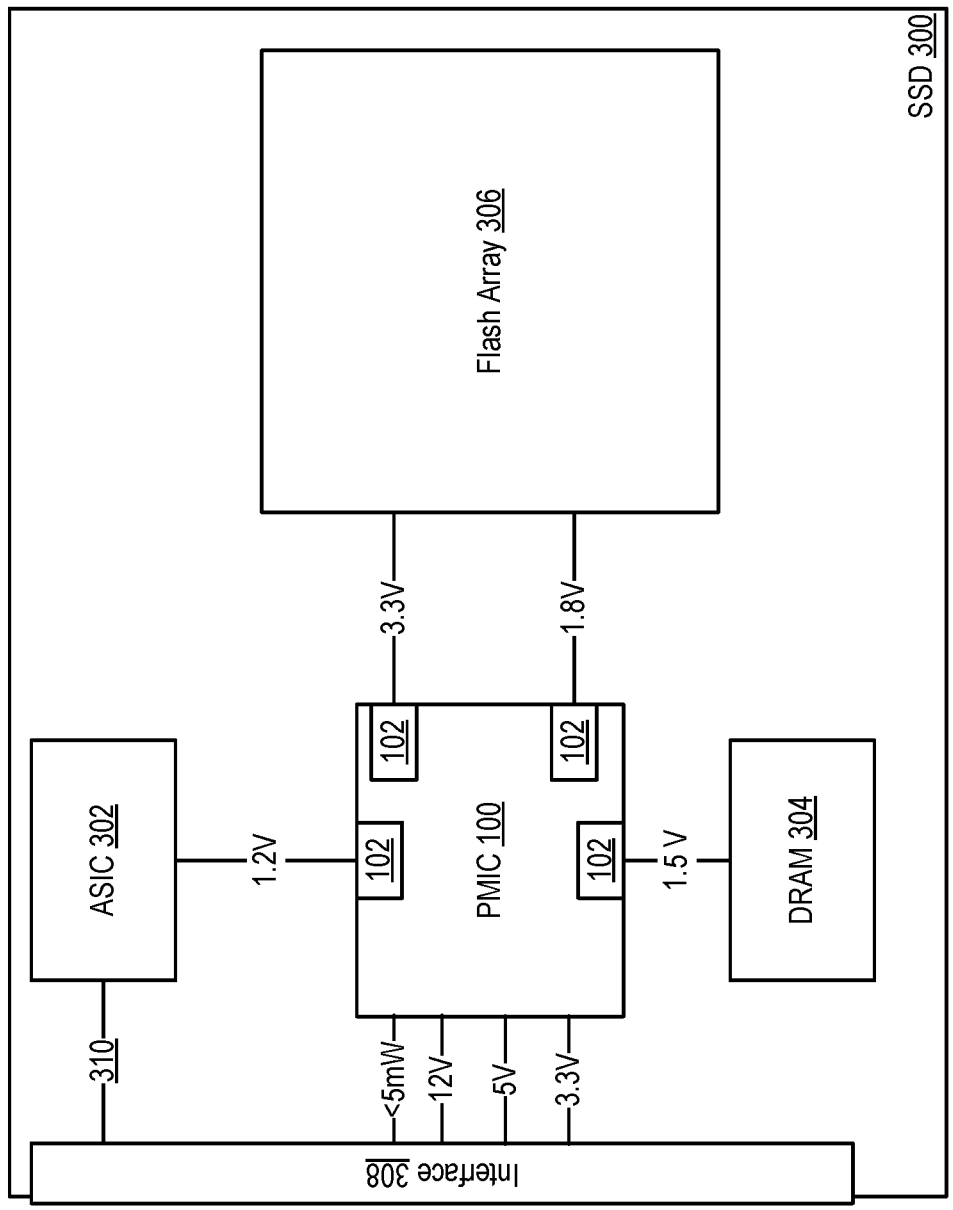
FIG. 3 is a block diagram illustrating an exemplary storage device and PMIC according to some embodiments of the disclosure.

FIG. 3 is a block diagram illustrating an exemplary storage device and PMIC according to some embodiments of the disclosure.

In the illustrated embodiment, PMIC (100) is installed within a board of the SSD (300). As illustrated, an interface (308) allows for data and power to be connected to the SSD (300). In one embodiment, the interface (308) comprises a SATA or PCI-E interface. In the illustrated embodiment, interface (308) enables data to be communicated to an application-specific integrated circuit (ASIC) (302) via path (310). In one embodiment, the interface (308) may utilize a block-based interface for the transfer of data. In the illustrated embodiment, ASIC (302) processes incoming request for data stored in array (306).

The interface (308) additionally includes power connections supplying various voltage levels to PMIC (100) as base voltage levels (e.g., 3.3V, 5V, and 12V). These voltage levels are used as base power rails throughout the PMIC. PMIC (100) may additionally include a power supply providing less than 5 mW of power to operate the PMIC (100) in sleep or low power mode.

As illustrated, PMIC (100) supplies the required voltages to various components of the SSD (300). For example, PMIC (100) supplies 1.5 V to DRAM (304), 1.2V to ASIC (302) and 3.3V and 1.8V to array (306).

In the illustrated embodiment, DRAM (304) stores a mapping of logical block addresses to physical block addresses of data in the array (306). In the illustrated embodiment, ASIC (302) accesses the DRAM (304) to convert logical block addresses received via path (110) into physical block addresses and accesses the array (306) to retrieve, write, and perform other operations on data in array (306).

In the illustrated embodiment, array (306) comprises a Flash array. In one embodiment, the array (306) comprises an array of NAND Flash packages connected via an internal bus.

As illustrated, the PMIC (100) includes load switch drivers (102) for each power output provided to components (302, 304, 306). Although not illustrated in FIG. 3, these power outputs are connected to components (302, 304, 306) via switches (such as switch (114) discussed in connection with FIG. 1.

Figure 4:
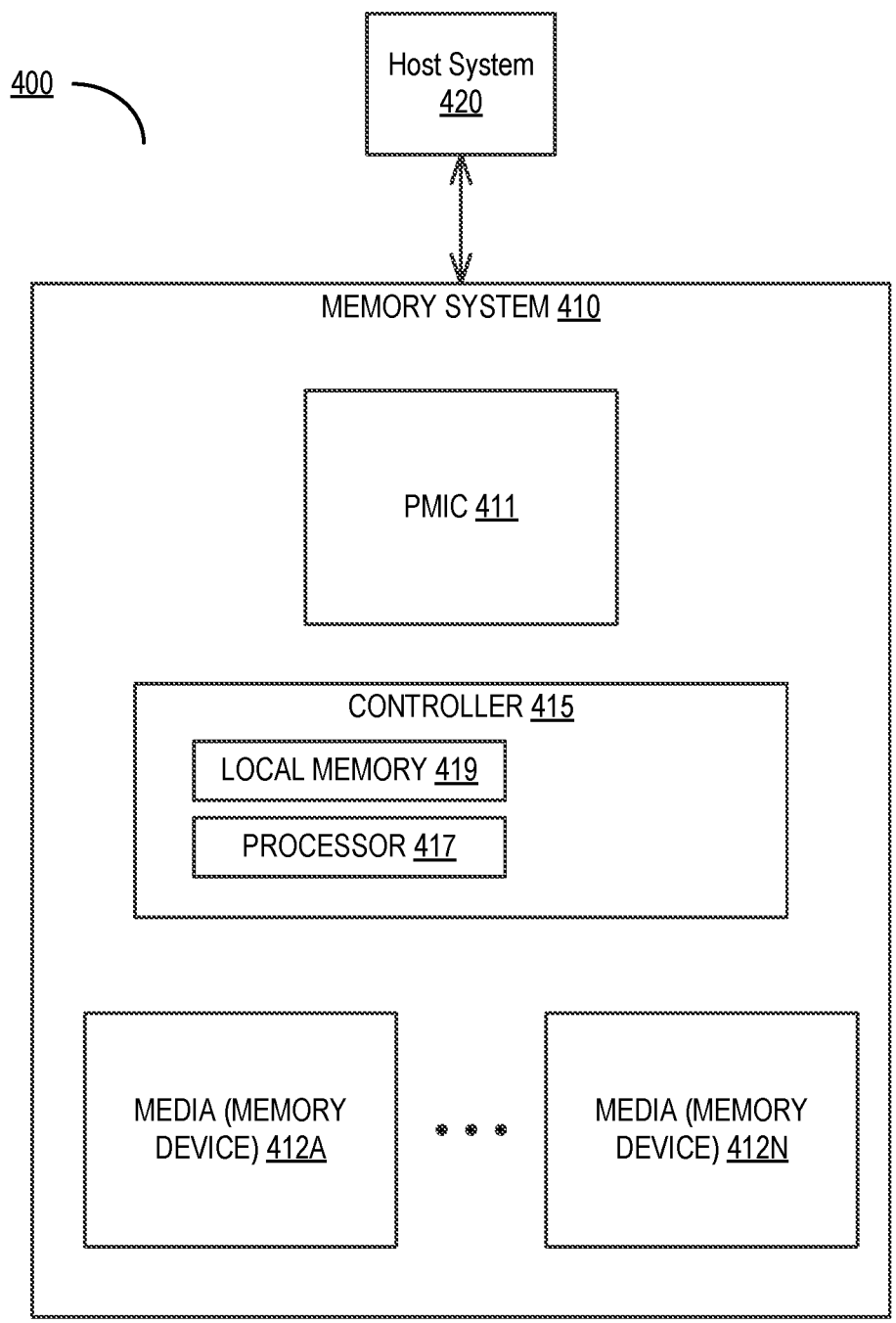
FIG. 4 illustrates an example computing environment that includes a memory system in accordance with some implementations of the present disclosure.

FIG. 4 illustrates an example computing environment 400 that includes a memory system 410 in accordance with some implementations of the present disclosure. The memory system 410 can include media, such as memory devices 412A to 412N. The memory devices 412A to 412N can be volatile memory devices, non-volatile memory devices, or a combination of such. In some embodiments, the memory system is a storage system. An example of a storage system is a SSD. In some embodiments, the memory system 410 is a hybrid memory/storage system. In general, the computing environment 400 can include a host system 420 that uses the memory system 410. In some implementations, the host system 420 can write data to the memory system 410 and read data from the memory system 410.

The host system 420 can be a computing device such as a desktop computer, laptop computer, network server, mobile device, or such computing device that includes a memory and a processing device. The host system 420 can include or be coupled to the memory system 410 so that the host system 420 can read data from or write data to the memory system 410. The host system 420 can be coupled to the memory system 410 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a Serial Advanced Technology Attachment (SATA) interface, a Peripheral Component Interconnect express (PCIe) interface, universal serial bus (USB) interface, Fibre Channel, Serial Attached SCSI (SAS), etc. The physical host interface can be used to transmit data between the host system 420 and the memory system 410. The host system 420 can further utilize an NVM Express (NVMe) interface to access the memory devices 412A to 412N when the memory system 410 is coupled with the host system 420 by the PCIe interface. The physical host interface can provide an interface for passing control, address, data, and other signals between the memory system 410 and the host system 420.

The memory devices 412A to 412N can include any combination of the different types of non-volatile memory devices and/or volatile memory devices. An example of non-volatile memory devices includes a negative-and (NAND) type flash memory. Each of the memory devices 412A to 412N can include one or more arrays of memory cells such as Single Level Cells (SLCs) or Multi-Level Cells (MLCs) (e.g., Triple Level Cells (TLCs) or Quad-Level Cells (QLCs)). In some implementations, a particular memory device can include both an SLC portion and a MLC portion of memory cells. Each of the memory cells can store bits of data (e.g., data blocks) used by the host system 420. Although non-volatile memory devices such as NAND type flash memory are described, the memory devices 412A to 412N can be based on any other type of memory such as a volatile memory. In some implementations, the memory devices 412A to 412N can be, but are not limited to, random access memory (RAM), Read-Only Memory (ROM), Dynamic Random Access Memory (DRAM), Synchronous Dynamic Random Access Memory (SDRAM), Phase Change Memory (PCM), Magneto Random Access Memory (MRAM), Negative-Or (NOR) flash memory, Electrically Erasable Programmable Read-Only Memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 412A to 412N can be grouped as memory pages or data blocks that can refer to a unit of the memory device used to store data.

The controller 415 can communicate with the memory devices 412A to 412N to perform operations such as reading data, writing data, or erasing data at the memory devices 412A to 412N and other such operations. The controller 415 can include hardware such as one or more integrated circuits and/or discrete components, a buffer memory, or a combination thereof. The controller 415 can be a microcontroller, special purpose logic circuitry (e.g., a Field Programmable Gate Array (FPGA), an Application Specific Integrated Circuit (ASIC), etc.), or other suitable processor. The controller 415 can include a processor (processing device) 417 configured to execute instructions stored in local memory 419. In the illustrated example, the local memory 419 of the controller 415 includes an embedded memory configured to store instructions for performing various processes, operations, logic flows, and routines that control operation of the memory system 410, including handling communications between the memory system 410 and the host system 420. In some embodiments, the local memory 419 can include memory registers storing, e.g., memory pointers, fetched data, etc. The local memory 419 can also include Read-Only Memory (ROM) for storing micro-code. While the example memory system 410 in FIG. 4 has been illustrated as including the controller 415, in another embodiment of the present disclosure, a memory system 410 may not include a controller 415, and may instead rely upon external control (e.g., provided by an external host, or by a processor or controller separate from the memory system).

In general, the controller 415 can receive commands or operations from the host system 420 and can convert the commands or operations into instructions or appropriate commands to achieve the desired access to the memory devices 412A to 412N. The controller 415 can be responsible for other operations such as wear leveling operations, garbage collection operations, error detection and Error-Correcting Code (ECC) operations, encryption operations, caching operations, and address translations between a logical block address and a physical block address that are associated with the memory devices 412A to 412N. The controller 415 can further include host interface circuitry to communicate with the host system 420 via the physical host interface. The host interface circuitry can convert the commands received from the host system into command instructions to access the memory devices 412A to 412N as well as convert responses associated with the memory devices 412A to 412N into information for the host system 420.

The memory system 410 can also include additional circuitry or components that are not illustrated. In some implementations, the memory system 410 can include a cache or buffer (e.g., DRAM) and address circuitry (e.g., a row decoder and a column decoder) that can receive an address from the controller 415 and decode the address to access the memory devices 412A to 412N.

The memory system 410 can include PMIC 411 (e.g., PMIC 100 in FIG. 1). The memory system 410 can include additional circuitry, such as illustrated in FIG. 1.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or microcontroller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, Read Only Memory (ROM), Random Access Memory (RAM), flash memory devices, floppy and other removable disks, magnetic disk storage media, and optical storage media (e.g., Compact Disk Read-Only Memory (CD ROM), Digital Versatile Disks (DVDS), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A circuit comprising:
   a switch;
   a frequency generator; and
   a voltage sensor configured to monitor a drain-source voltage of the switch, and lower a frequency of the frequency generator in response to detecting a collapse of the drain-source voltage of the switch.

2. The circuit of claim 1, further comprising a gate driver coupled to a gate of the switch, the gate driver comprising one or more of a charge pump or push-pull driver.

3. The circuit of claim 1, the switch comprising a MOSFET switch.

4. The circuit of claim 1, wherein the lowering of the frequency comprising lowering the frequency to a frequency between 8.5 and 12 kHz.

5. The circuit of claim 1, further comprising operating a gate voltage of the switch at a frequency of between 200 and 400 kHz prior to lowering the operation frequency.

6. The circuit of claim 1, further comprising at least one voltage regulator and at least one sequencer.

7. The circuit of claim 1, the monitoring the drain-source voltage of the switch comprising comparing the drain-source voltage to a known breakdown voltage of the switch.

8. The circuit of claim 1, the monitoring the drain-source voltage of the switch comprising monitoring instantaneous voltage changes of the drain-source voltage.

9. A system comprising:
a load switch driver; and
one or more memory devices coupled to the load switch driver, the load switch driver configured to monitor a drain-source voltage of a switch, and lower a frequency of a frequency generator in response to detecting a collapse of the drain-source voltage of the switch.

10. The system of claim 9, further comprising second and third load switch drivers.

11. The system of claim 10, the second load switch driver coupled, via a second switch to a DRAM device.

12. The system of claim 10, the third load switch driver coupled, via a third switch to an ASIC device.

13. The system of claim 9, the load switch driver comprising:
a gate driver, the gate driver connected to a gate of the switch;
the frequency generator connected to the gate driver and configured to supply a periodic voltage to the gate driver; and
a voltage sensor, the voltage sensor connected to the frequency generator and a source of the switch, the voltage sensor configured to monitor the drain-source voltage of the switch.

14. The system of claim 13, the periodic voltage supplied at a frequency between 200 and 400 kHz.

15. The system of claim 13, the lowering the frequency comprising lowering the frequency to a value between 8.5 and 12 kHz.

16. A method comprising:
monitoring a drain-source voltage of a switch;
determining that the drain-source voltage of the switch has collapsed; and
lowering a frequency of a frequency generator in response to determining that the drain-source voltage has collapsed.

17. The method of claim 16, further comprising turning on a gate of the switch with an operating frequency between 200 and 400 kHz, the turning on performed prior to the monitoring.

18. The method of claim 16, further comprising supplying a gate voltage to a gate of the switch at a frequency between 8.5 and 12 kHz.

19. The method of claim 16, the determining that the drain-source voltage of the switch has collapsed comprising comparing the drain-source voltage to a known breakdown voltage of the switch.

20. The method of claim 16, the determining the drain-source voltage of the switch has collapsed comprising monitoring instantaneous voltage changes of the drain-source voltage.

* * * * *